(12) United States Patent
Mourou et al.

(10) Patent No.: US 11,325,283 B2
(45) Date of Patent: May 10, 2022

(54) INJECTED LED LIGHT ASSEMBLY

(71) Applicant: GM GLOBAL TECHNOLOGY OPERATIONS LLC, Detroit, MI (US)

(72) Inventors: Julien P. Mourou, Bloomfield Hills, MI (US); Bradley J. Tice, Warren, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 142 days.

(21) Appl. No.: 16/821,366

(22) Filed: Mar. 17, 2020

(65) Prior Publication Data

US 2021/0291416 A1    Sep. 23, 2021

(51) Int. Cl.
*B29C 37/00* (2006.01)
*H01L 25/075* (2006.01)
*H05K 1/18* (2006.01)
*H01L 33/56* (2010.01)
*H01L 33/00* (2010.01)

(52) U.S. Cl.
CPC ...... *B29C 37/0028* (2013.01); *H01L 25/0753* (2013.01); *H01L 33/005* (2013.01); *H01L 33/56* (2013.01); *H05K 1/189* (2013.01)

(58) Field of Classification Search
CPC .............. B29C 37/0028; B29C 45/14; B29C 2037/0035; H01L 25/0753; H01L 33/005; H01L 33/56; H05K 1/189
See application file for complete search history.

(56) References Cited

U.S. PATENT DOCUMENTS

| | | | | |
|---|---|---|---|---|
| 9,149,960 | B2* | 10/2015 | Oeuvrard | B29C 45/44 |
| 2006/0028837 | A1* | 2/2006 | Mrakovich | F21S 4/22 |
| | | | | 362/602 |
| 2008/0204524 | A1* | 8/2008 | Petranek | B41J 2/1752 |
| | | | | 347/86 |
| 2008/0265459 | A1* | 10/2008 | Gasworth | B29C 45/0053 |
| | | | | 264/255 |
| 2009/0184118 | A1* | 7/2009 | Kobayashi | B62J 35/00 |
| | | | | 220/62.22 |
| 2013/0250607 | A1* | 9/2013 | Schmuck | G02B 6/0093 |
| | | | | 362/602 |

* cited by examiner

*Primary Examiner* — Robert G Bachner
(74) *Attorney, Agent, or Firm* — Quinn IP Law

(57) ABSTRACT

A light assembly and method of forming light assemblies includes a flexible light layer, a thermoplastic housing, and an IMC layer. The flexible light layer has a flexible substrate, a printed circuit, and a plurality of LEDs extending outward from the flexible substrate. The IMC layer is formed opposite the flexible light layer from the thermoplastic housing and covers the LEDs. Forming may include placing the flexible light layer within a mold cavity, injecting the thermoplastic structure on one side of the flexible light layer, and injecting the IMC layer on the opposite side of the flexible light layer from the thermoplastic structure. Injecting the thermoplastic structure into the mold cavity may change the shape of the flexible light layer. Datum features of the flexible light layer may align the thermoplastic structure relative to the datum features.

12 Claims, 2 Drawing Sheets

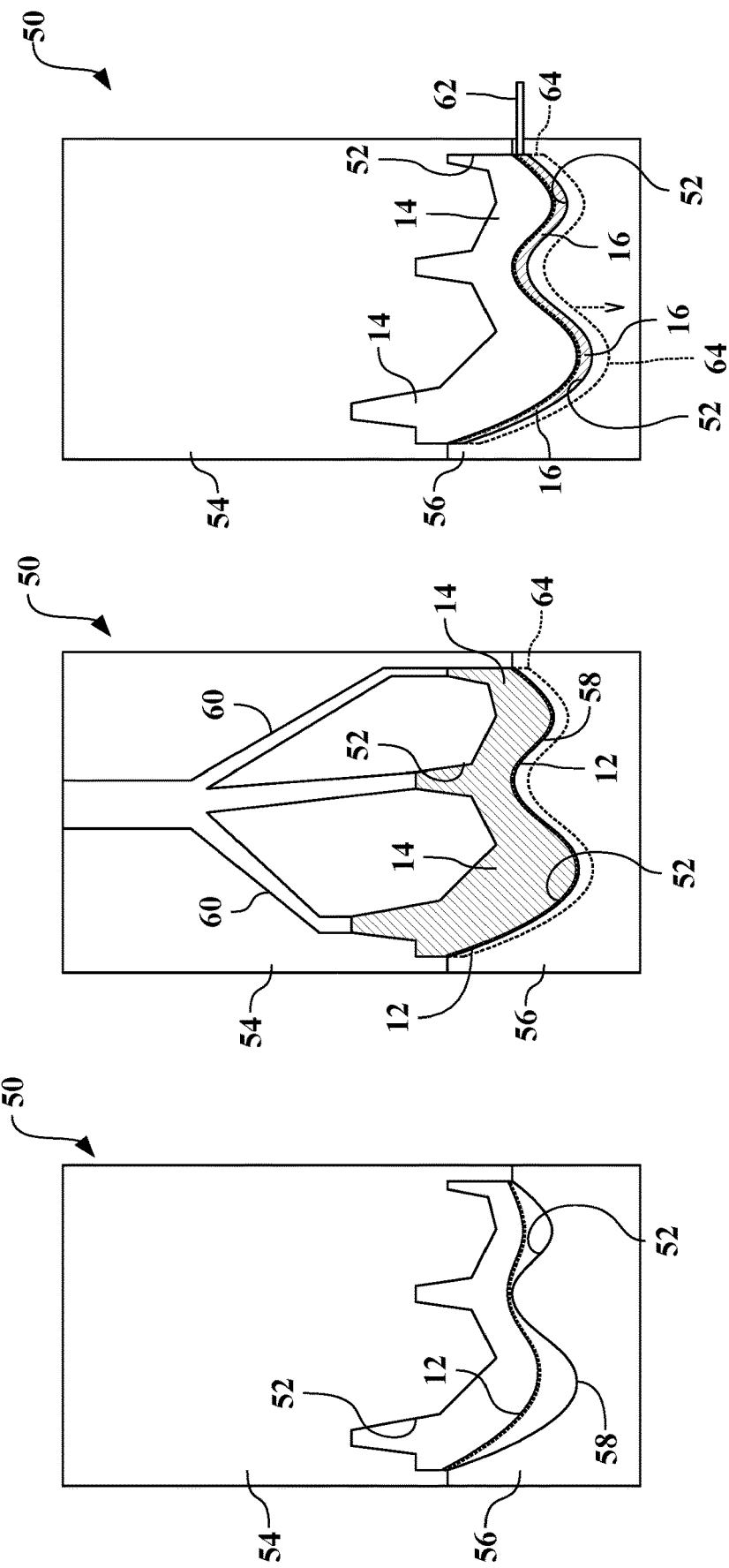

INJECTED LED LIGHT ASSEMBLY

INTRODUCTION

The present disclosure relates to protected LED light assemblies and mechanisms and methods for making the same.

SUMMARY

A light assembly and method of forming light assemblies are provided. The light assembly includes a flexible light layer, a thermoplastic housing, and an in-mold-coated (IMC) layer. The flexible light layer has a flexible substrate, a circuit printed on the flexible substrate, and a plurality of LEDs operatively attached to the printed circuit and extending outward from the flexible substrate. The thermoplastic housing is formed on one side of the flexible light layer, opposite the plurality of LEDs, and the IMC layer is formed opposite the flexible light layer from the thermoplastic housing. The IMC layer covers and protects the LEDs.

Forming the light assemblies may include placing the flexible light layer within a mold cavity, and injecting the thermoplastic structure into the mold cavity on one side of the flexible light layer. The IMC layer is injected onto the opposite side of the flexible light layer from the thermoplastic structure. The flexible light layer may have a first shape when placed into the mold cavity, such that injecting the thermoplastic structure into the mold cavity changes the shape of the flexible light layer to a second shape, different from the first shape. Datum features of the flexible light layer may be aligned within the mold cavity, such that portions of the thermoplastic structure are aligned relative to the datum features.

In some configurations, the mold cavity includes a movable wall. Injecting the thermoplastic structure occurs while the movable wall is in a first position, such that the flexible light layer is adjacent the movable wall, and injecting the IMC layer occurs while the movable wall is in a second position, such that the thermoplastic structure and the IMC layer are both injected into the same mold cavity.

In some configurations, the light assemblies are formed in a rotary molding machine. Injecting the thermoplastic structure occurs at a first station of the rotary molding machine; and injecting the IMC layer occurs at a second station. Therefore, the rotary molding machine moves the thermoplastic structure from the first station to the second station.

In some configurations, the flexible light layer is thermoformed prior to placing the flexible light layer within the mold cavity. The IMC layer may be formed from one of urethane, silicone, or PMMA, and the flexible substrate may be formed from one of polyamide, PEEK, or transparent polyester film.

The above features and advantages and other features and advantages of the present disclosure are readily apparent from the following detailed description of the best modes for carrying out the disclosure when taken in connection with the accompanying drawings.

BRIEF DESCRIPTION OF THE DRAWINGS

FIG. 3A is a schematic diagram illustrating a first portion, movement, or step of forming an LED light assembly, such as those shown in the figures.

FIG. 3B is a schematic diagram illustrating a second portion, movement, or step of forming an LED light assembly, such as those shown in the figures.

FIG. 3C is a schematic diagram illustrating a third portion, movement, or step of forming an LED light assembly, such as those shown in the figures.

DETAILED DESCRIPTION

Figure 1:
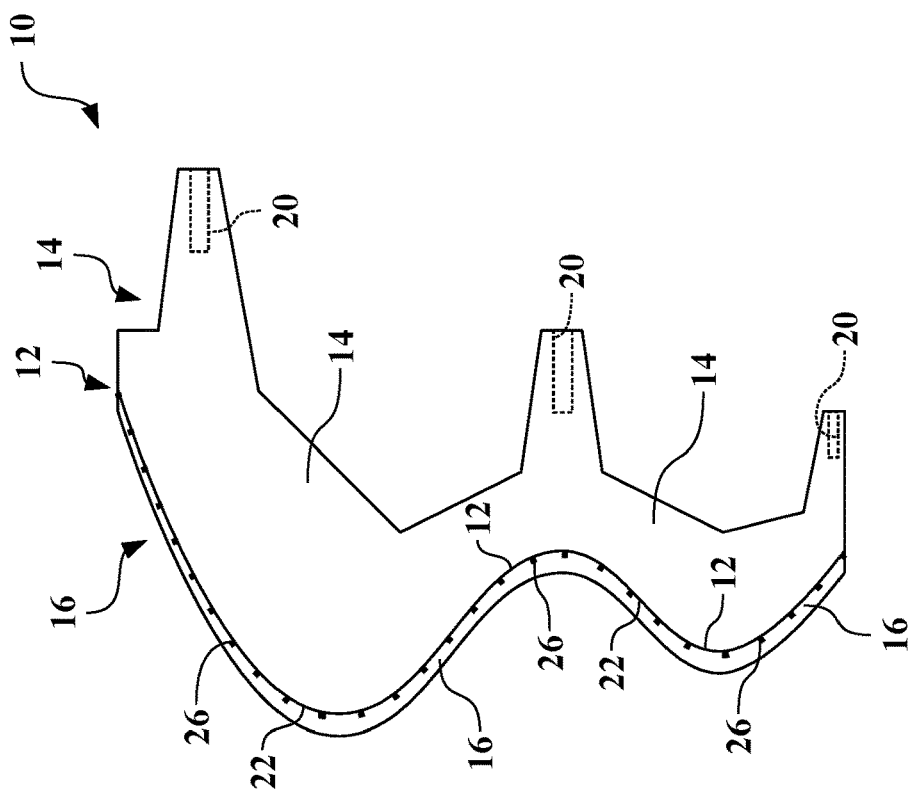
FIG. 1 is a schematic side diagrammatic view of an LED light assembly.

Referring to the drawings, like reference numbers refer to similar components, wherever possible. FIG. 1 schematically illustrates a light assembly 10, which is generally shown as a side view or a plane-intersection view to illustrate the interior components thereof.

As viewed in FIG. 1, the light assembly has a light layer 12, a thermoplastic housing 14 or thermoplastic structure on one side of the light layer 12, and an in-mold-coating (IMC) layer 16 on the other side of the light layer 12. The thermoplastic housing 14 is formed on, and attached to, a first side of the light layer 12, and the IMC layer 16 is formed on, and attached to, a second side of the light layer 12, opposite the thermoplastic housing 14.

The light assembly 10 may be used on vehicles or for display lighting on other structures. When used for vehicles, the light assembly 10 may be used as, for example, and without limitation, interior or exterior lighting, and may be used for display or communication lighting, such as scrolling text or pictures, or for primary lighting, such as headlamps, break lamps, or signal indicators. As described herein, the light layer 12 provides the structural elements that produce or cast the light.

The thermoplastic housing 14 may be referred to as the B-side of the light assembly 10, and includes structural elements and features for aligning the light assembly 10 relative to the vehicle. The thermoplastic housing 14 is generally formed via injection molding. As shown in FIG. 1, a plurality of attachment features 20 are formed in the thermoplastic housing 14. The thermoplastic housing 14 may be formed from, for example and without limitation: numerous types of thermoplastic, other hard plastics, or combinations thereof.

Note that the thermoplastic housing 14 is illustrated highly schematically. In many configurations, the thermoplastic housing 14 would include structural ribs and other features that reduce the overall weight of the thermoplastic housing 14 while providing sufficient strength and structure to support the light assembly 10 relative to the attachment features 20 and the structures to which the light assembly 10 is attached.

The drawings and figures presented herein are not to scale and are provided purely for instructional purposes. Any specific or relative dimensions shown in the drawings are not to be construed as limiting. For example, the IMC layer 16 shown in FIG. 1, and other figures, may be oversized for illustration.

The IMC layer 16 may be referred to as the A-side of the light assembly 10 and includes aesthetic features and functions. The IMC layer 16 also protects the light layer 12 from light damage (such as from ultraviolet light), corrosion, and scratch damage. The IMC layer 16 may be formed from, for example, and without limitation: urethane, silicone, polymethyl methacrylate (PMMA), or combinations thereof.

The combination of the flexible light layer 12, the injected thermoplastic housing 14, and the protective IMC layer 16 allow the light assembly 10 to have a complex A-side, while still being manufacturable and attachable to vehicles via standard means. Manufacturing of the light assembly 10 is discussed in more detail below, particularly with reference to FIGS. 3A-C. Note that the light assembly 10 is capable of being formed with multiple curves, including small radius curves (smaller than 10 millimeters) and multiple curves or elements in close proximity.

Any reference to vehicles may be representative of any rolling platform, including, without limitation: motorcycles, tractors, buses, mobile homes, campers, and tanks. Furthermore, the components described herein may also be used in a variety of other industries and applications, including, without limitation: aerospace applications, consumer goods, industrial and construction equipment, farm equipment, heavy machinery, or display lighting.

While the disclosure may be illustrated with respect to specific applications or industries, those skilled in the art will recognize the broader applicability of the disclosure. Those having ordinary skill in the art will recognize that terms such as "above," "below," "upward," "downward," et cetera, are used descriptively of the figures, and do not represent limitations on the scope of the disclosure or the appended claims. Any numerical designations, such as "first" or "second" are illustrative only and are not intended to limit the scope of the disclosure in any way.

Features shown in one figure may be combined with, substituted for, or modified by, features shown in any of the figures. Unless stated otherwise, no features, elements, or limitations are mutually exclusive of any other features, elements, or limitations. Furthermore, no features, elements, or limitations are absolutely required for operation. Any specific configurations shown in the figures are illustrative only and the specific configurations shown are not limiting of the claims or the description.

When used herein, the term "substantially" refers to relationships that are ideally perfect or complete, but where manufacturing realties prevent absolute perfection. Therefore, substantially denotes typical variance from perfection. For example, if height A is substantially equal to height B, it may be preferred that the two heights are 100.0% equivalent, but manufacturing realities likely result in the distances varying from such perfection. Skilled artisans would recognize the amount of acceptable variance. For example, and without limitation, coverages, areas, or distances may generally be within 10% of perfection for substantial equivalence. Similarly, relative alignments, such as parallel or perpendicular, may generally be considered to be within 5-10%.

Figure 2:
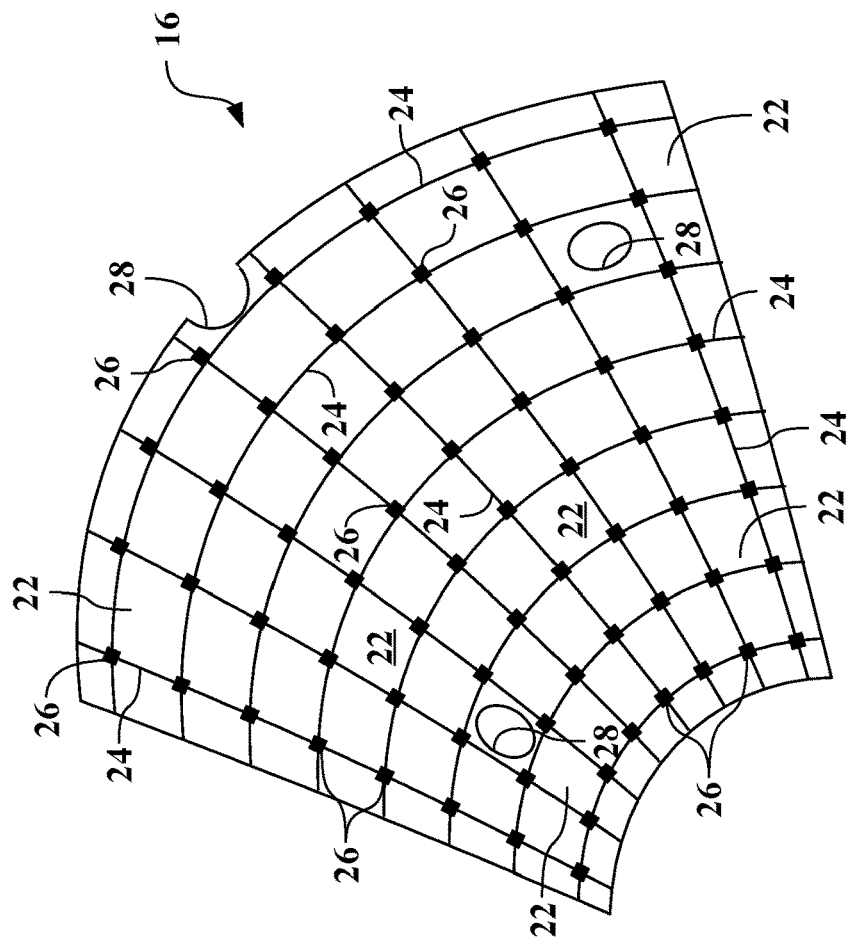
FIG. 2 is a schematic isometric view of a segment of a flexible LED light layer.

Referring to FIG. 2, and with continued reference to FIG. 1, there is shown a schematic isometric view of a portion of the light layer 12, which may form part of the light assembly 10. The light layer 12 is generally formed from a flexible substrate 22, a printed circuit 24, and a plurality of light emitting diodes (LEDs) 26.

The flexible substrate 22 may be formed from, for example and without limitation: polyamide, PEEK, or transparent polyester film. The printed circuit 24 is printed on the flexible substrate 22, and the LEDs 26 are operatively attached to the printed circuit 24, such that the printed circuit 24 provides electricity to, and therefore control of, the LEDs 26. For example, the LEDs 26 may be attached to the printed circuit 24 with, for example, and without limitation, conductive adhesives or solders. Note that the printed circuit 24 is not shown in detail and there may be additional wires formed of conductive or dielectric ink traces, in addition to masking or nonconductive traces, printed on the flexible substrate 22.

In many configurations, the LEDs 26 will extend outward from the flexible substrate 22, as best illustrated in FIG. 1, although the figures are not to scale. In the configuration shown, the LEDs 26 extend opposite the thermoplastic housing 14, such that the thermoplastic housing 14 is injected on, and attached to, the opposing side of the light layer 12 from the LEDs 26.

Skilled artisans will recognize numerous techniques for forming the flexible light layer 12. For example, and without limitation, the printed circuit 24 may be applied to the flexible substrate 22 via direct printing or 3D printing techniques. Although not illustrated in the figures, the printed circuit 24 may extend outward from the flexible substate 22.

Additive manufacturing processes may be used to apply conductive ink or paste to the flexible substrate 22. For example, and without limitation, alternating layers of conductive and nonconductive (masking or via) materials may be printed onto the flexible substrate 22, such that a three-dimensional circuit layout is created for the printed circuit 24.

The LEDs 26 may be attached to the printed circuit 24 with, for example, and without limitation, adhesives or conductive pastes. Additionally, the printed circuit 24 may be formed on the flexible substrate 22 via removal processes, such as etching or other micromachining processes. The IMC layer 16 is injected opposite the light layer 12 from the thermoplastic housing 14, such that it covers the LEDs 26 extending away from the flexible substrate 22 and the printed circuit 24.

Connections for control and operation of the light assembly 10 are not illustrated in the figures. However, the light layer 12 may have, for example and without limitation, wiring harnesses or connectors extending therefrom. A suitable control system or controller structure may be operatively attached to the light layer 12 for operation of the light assembly 10. In some configurations, the connectors or plugs that interface with the light layer 12 may be incorporated into—either during formation or via post-processing—the thermoplastic housing 14.

In many configurations of the light assembly 10 of claim 1, the flexible substrate 22 of the light layer 12 may be transparent. Therefore, if the IMC layer 16 is also transparent, the thermoplastic housing 14 is viewable through the IMC layer 16 and the flexible substrate 22. The thermoplastic housing 14 may, therefore, provide aesthetics for the overall light assembly 10 by having its coloration or features show through to the A-side of the light assembly 10. Additionally, note that where the LEDs 26 extend substantially outward from the flexible substrates 22, the extended LEDs 26 will be viewable through the IMC layer 16, which may provide interesting aesthetic features to the light assembly 10.

As discussed herein, the light assembly 10 may be formed by insert molding the thermoplastic housing 14 around the light layer 12. Therefore, a plurality of datum features 28 may be formed on the flexible substrate 22 of the light layer 12, as illustrated in FIG. 2. These datum features 28 may orient the light layer 12 within the injection molding apparatus relative to the attachment features 20 of the thermoplastic housing 14. The datum features 28 are illustrated in FIG. 2 as holes or slots, but skilled artisans will recognize several types of datum features 28 that may be used to align the light layer 12.

Referring also to FIGS. 3A, 3B, and 3C, and with continued reference to FIGS. 1-2, there are illustrated structures, mechanisms, and methods for producing light assemblies, such as the light assembly 10 schematically shown in FIG. 1. Each of FIGS. 3A, 3B, and 3C schematically show different movements, portions, configurations, or variations of an injection molding apparatus 50. For example, and without limitation, the injection molding apparatus 50 may be: a rotary injection system, a movable cavity system, or a pick-and-place molding system.

As illustrated in FIG. 3A, forming the light assembly 10 may include placing the flexible light layer 12 within a mold cavity 52, which is generally defined by a first platen 54 and a second platen 56. Either of the first platen 54 and the second platen 56 may be movable or fixed relative to one another and the mold cavity 52.

In FIG. 3A, the flexible light layer 12 is shown with a shape that partially resembles the shape of one of the walls, which may be referred to as a light-side wall 58, of the mold cavity 52. However, in some configurations, the flexible light layer 12 may be substantially flat, or unshaped, when placed into the mold cavity 52. Alternatively, the flexible light layer 12 may be preformed or pre-shaped, such as by thermoforming, to substantially its final shape prior to placement within the mold cavity 52.

If included, the datum features 28 (not shown in FIGS. 3A-C) may be used to align the flexible light layer 12 within the mold cavity 52. The printed circuit 24 may also be formed to accommodate space for the datum features 28.

As schematically illustrated in FIG. 3B, the thermoplastic housing 14 is injected into the mold cavity 52 through a plurality of sprues 60. Therefore, the thermoplastic housing 14 is formed on, and attached to, one side of the flexible light layer 12. During the injection process, the flexible light layer 12 conforms to the shape of a portion of the mold cavity 52, such as the light-side wall 58. The flexible light layer 12 is aligned relative to the thermoplastic housing 14 via either the datum features 28 or the interior shape of the mold cavity 52.

Injecting the thermoplastic housing 14 generally forms the B-side structure of the light assembly 10. The thermoplastic housing 14 is shown with hatching in FIG. 3B to schematically illustrate the injected portion. Note the injection molding apparatus 50 may control the pressure of the materials being injected in order to prevent damage to the light layer 12. The attachment features 20 (not shown in FIGS. 3A-C) may also be formed during injection of the thermoplastic housing 14 or may be formed during post-injection processing. The injection process forces the flexible light layer 12 against the mold cavity 52.

Note that because the printed circuit 24 is printed on the flexible substrate 22, some modification to the layout of the printed circuit 24, as opposed to the lateral grid illustrated in FIG. 2, may be beneficial if the flexible light layer 12 will be substantially deformed. While the shapes illustrated in the figures are generally larger radius curves, the flexible light layer 12 may be flexed into complex shapes having small radius curves and/or features located in close proximity to one another. Therefore, skilled artisans will recognize that, in order to maintain control over the individual LEDs 26, the shape of the printed circuit 24, and the pathways of the individual connections forming the printed circuit 24, may be designed with the final shape of the flexible light layer 12 in mind.

As schematically illustrated in FIG. 3C, the IMC layer 16 is injected into the mold cavity 52 onto the opposite side of the flexible light layer 12 from the thermoplastic housing 14. The IMC layer 16 is injected via an IMC injector 62 and coats the flexible light layer 12 while it is still within the molding apparatus 50. This process generally forms the A-side aesthetic and protective layer of the light assembly 10. The IMC layer 16 is shown with hatching in FIG. 3C to schematically illustrate the injected portion.

The injection molding apparatus 50 schematically illustrated in FIGS. 3A-C may represent several different molding systems or structures, including, without limitation: rotary injection systems, movable cavity systems, or pick-and-place systems. In some configurations, the mold cavity 52 may include, or be partially defined by, a movable wall 64, which is illustrated in FIGS. 3B and 3C. In such movable cavity systems, the movable wall 64 may form all, or part of, the light-side wall 58.

The injection molding apparatus 50 may slide the movable wall 64 between, at least, a first position and a second position. The first position of the movable wall 64 is illustrated in FIG. 3B and the second position of the movable wall 64 is illustrated in FIG. 3C. In the second position, the movable wall 64 has moved downward, relative to the view of FIGS. 3B and 3C.

The thermoplastic housing 14 is injected while the movable wall 64 is in the first position and injecting the thermoplastic housing 14 pushes the flexible light layer 12 against the movable wall 64, as shown in FIG. 3B. The injection molding apparatus 50 may then slide the movable wall 64 outward (down, as viewed in FIG. 3C) to create space for the IMC layer 16. The IMC layer 16 is injected while the movable wall 64 is in the second position, such that the thermoplastic housing 14 and the IMC layer 16 are both injected into the same mold cavity 52 in movable cavity systems.

The additional space created by the movable wall 64 allows the IMC layer 16 to cover the LEDs 26, which had been pressed against the mold cavity 52 during injection of the thermoplastic housing 14. The IMC layer 16 also covers, and protects, the A-side faces of the printed circuit 24 and/or the flexible substrate 22.

In other configurations, the injection molding apparatus 50 may be part of a rotary molding machine, such that each of the views of FIGS. 3A, 3B, and 3C represents stages or stations of the rotary molding process. The flexible light layer 12 may be placed into the mold cavity 52 at the same station as injection of the thermoplastic housing 14, or may be placed into the mold cavity 52 at a prior station.

The thermoplastic housing 14 may be injected at a first station of the rotary molding machine, and the IMC layer 16 may be injected at a second station, such that the rotary molding machine moves the thermoplastic housing 14 from the first station to the second station. Movement of the thermoplastic housing 14 may occur after at least partial cooling or solidification of the thermoplastic housing 14, depending on configuration of the rotary injection molding apparatus 50.

For example, and without limitation, portions of the first platen 54 may move from the first station to the second station, with the thermoplastic housing 14. The second station would have additional room in the mold cavity 52 for injection of the IMC layer 16 (as represented by comparison between FIGS. 3B and 3C). Note that the size and shape of the first platen 54 and the second platen 56, in addition to the remainder of the injection molding apparatus 50, are only descriptive illustrations and may not be representative of the structures of a rotary molding system.

In another configuration, which may be somewhat analogous to the rotary molding machine, the injection molding apparatus 50 may be part of a pick-and-place system. For example, the flexible light layer 12 may be placed into the mold cavity 52 and have the thermoplastic housing 14 injected onto its B-side, as shown in FIG. 3B. However, the flexible light layer 12 and the thermoplastic housing 14 would then be removed from the mold cavity 52 and moved into a second cavity—one that has space for the IMC layer 16. Movement may be affected by a human operator or robotics.

Then, similar to the view of FIG. 3C, in the second cavity the IMC layer 16 will be injected over the A-side of the flexible light layer 12 and the thermoplastic housing 14. Relative to the movable mold or rotary systems, the pick-and-place system may be more labor intensive but may have reduced set up cost.

Again, note that some configurations may have complex shapes on the A-side of the light assembly 10. Therefore, the flexible light layer 12 may be thermoformed prior to insertion into the mold cavity 52, or as a first step within the injection molding apparatus 50, prior to injection of the thermoplastic housing 14. This may be a full or partial thermoforming step, such that the flexible light layer 12 may be shaped to substantially its final shape or may be partially shaped to allow the final shaping to occur during injection of the thermoplastic housing 14.

For example, the shape of the flexible light layer 12 shown in FIG. 3A may have been thermoformed from a generally flat shape to the shape shown. Therefore, the flexible light layer 12 partially matches the shape of the light-side wall 58 and is better equipped to conform to the shape of that portion of the mold cavity 52 as a result of the thermoforming.

The detailed description and the drawings or figures are supportive and descriptive of the subject matter herein. While some of the best modes and other embodiments have been described in detail, various alternative designs, embodiments, and configurations exist.

Furthermore, any embodiments shown in the drawings or the characteristics of various embodiments mentioned in the present description are not necessarily to be understood as embodiments independent of each other. Rather, it is possible that each of the characteristics described in one of the examples of an embodiment can be combined with one or a plurality of other desired characteristics from other embodiments, resulting in other embodiments not described in words or by reference to the drawings. Accordingly, such other embodiments fall within the framework of the scope of the appended claims.

The invention claimed is:

1. A method of forming light assemblies, comprising:
    placing a flexible light layer within a mold cavity, wherein the mold cavity is defined by a first platen and a second platen;
    injecting a thermoplastic structure into the mold cavity on one side of the flexible light layer; and
    injecting an in-mold-coating (IMC) layer onto the opposite side of the flexible light layer from the thermoplastic structure,
    wherein the flexible light layer has a first shape that does not conform to either the first platen or the second platen, when placed into the mold cavity, and
    wherein injecting the thermoplastic structure into the mold cavity changes the shape of the flexible light layer to a second shape, different from the first shape, wherein the second shape conforms to one of the first platen or the second platen.

2. The method of claim 1, wherein the flexible light layer includes:
    a flexible substrate;
    a printed circuit formed on one side of the flexible substrate; and
    a plurality of LEDs operatively attached to the printed circuit and extending from the flexible substrate opposite the thermoplastic structure and covered by the IMC layer.

3. The method of claim 2, further comprising:
    aligning a plurality of datum features formed on the flexible light layer within the mold cavity, such that portions of the thermoplastic structure are aligned relative to the datum features.

4. The method of claim 3, wherein the mold cavity includes a movable wall, and further comprising:
    injecting the thermoplastic structure while the movable wall is in a first position, such that the flexible light layer is changed to the second shape adjacent the movable wall; and
    injecting the IMC layer while the movable wall is in a second position, such that the thermoplastic structure and the IMC layer are both injected into the same mold cavity.

5. The method of claim 3, wherein the light assemblies are formed in a rotary molding machine, and further comprising:
    injecting the thermoplastic structure at a first station of the rotary molding machine; and
    injecting the IMC layer at a second station, wherein the rotary molding machine moves the thermoplastic structure from the first station to the second station.

6. The method of claim 3, further comprising:
    thermoforming the flexible light layer prior to placing the flexible light layer within the mold cavity.

7. The method of claim 3,
    wherein the IMC layer is formed from one of urethane, silicone, or PMMA; and
    wherein the flexible substrate is formed from one of polyamide, PEEK, or transparent polyester film.

8. The method of claim 1, further comprising:
    thermoforming the flexible light layer to the first shape, prior to placing the flexible light layer within the mold cavity.

9. The method of claim 1, wherein the mold cavity includes a movable wall, and further comprising:
    injecting the thermoplastic structure while the movable wall is in a first position, such that the flexible light layer is changed to the second shape adjacent the movable wall; and
    injecting the IMC layer while the movable wall is in a second position, such that the thermoplastic structure and the IMC layer are both injected into the same mold cavity.

10. The method of claim 9, wherein the light assemblies are formed in a rotary molding machine, and further comprising:
    injecting the thermoplastic structure at a first station of the rotary molding machine; and
    injecting the IMC layer at a second station, wherein the rotary molding machine moves the thermoplastic structure from the first station to the second station.

11. The method of claim 1, wherein the light assemblies are formed in a rotary molding machine, and further comprising:
    injecting the thermoplastic structure at a first station of the rotary molding machine; and injecting the IMC layer at a second station, wherein the rotary molding machine moves the thermoplastic structure from the first station to the second station.

12. The method of claim 1,
wherein the IMC layer is formed from one of urethane, silicone, or PMMA; and
wherein the flexible substrate is formed from one of polyamide, PEEK, or transparent polyester film.

* * * * *